(12) United States Patent
Kang

(10) Patent No.: US 7,511,983 B2
(45) Date of Patent: *Mar. 31, 2009

(54) MEMORY DEVICE WITH HIERARCHY BIT LINE

(75) Inventor: Hee Bok Kang, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 100 days.

This patent is subject to a terminal disclaimer.

(21) Appl. No.: 11/677,630

(22) Filed: Feb. 22, 2007

(65) Prior Publication Data

US 2007/0201260 A1  Aug. 30, 2007

(30) Foreign Application Priority Data

Feb. 22, 2006  (KR) ...................... 10-2006-0016992

(51) Int. Cl.
*G11C 11/22* (2006.01)
*G11C 11/24* (2006.01)

(52) U.S. Cl. ..................................... 365/145
(58) Field of Classification Search ................ 365/145, 365/149, 207
See application file for complete search history.

(56) References Cited

U.S. PATENT DOCUMENTS 5,852,571 A * 12/1998 Kinney ........................ 365/145
6,097,624 A * 8/2000 Chung et al. ................. 365/145
6,862,204 B2 * 3/2005 Kouichi ........................ 365/63
2004/0130926 A1 * 7/2004 Nakase ........................ 365/145

FOREIGN PATENT DOCUMENTS

KR   1999-029164 A   4/1999

* cited by examiner

Primary Examiner—Anh Phung
(74) Attorney, Agent, or Firm—Ladas & Parry LLP

(57) ABSTRACT

The present invention relates to a memory device with a hierarchy bit line. In a FeRAM with folded bit lines and opened bit lines, it has a hierarchy bit line where bit line signals in two or more columns commonly share one global bit line signal. In the hierarchy bit line, cell array blocks with the folded bit lines transferred with cell data of FeRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines. The present invention has an effect of providing a cell array structure effectively adapted to construct an ECC circuit because it has a hierarchy construction where bit line signals in two columns or four columns commonly share one global bit line signals.

10 Claims, 8 Drawing Sheets

MEMORY DEVICE WITH HIERARCHY BIT LINE

TECHNICAL FIELD

The present invention relates to a memory device with a hierarchy bit line.

BACKGROUND ART

As a cell size is small, cell array capacity is increased, and operation voltage is low, the possibility of fail in the cell is increased. The cell defect is caused by physical damage, impurity migration, write fatigue, and electrical signal fluctuation, and the like. A need exists for an Error Checking and Correcting (ECC) circuit in order to relieve such defects.

In a conventional cell array structure, there has been consumed many spaces for constructing the circuit. Therefore, it is difficult to effectively construct the ECC circuit in the conventional cell array structure. Consequently, there has been demanded a development of a new cell array structure capable of effectively constructing the ECC circuit.

DISCLOSURE OF THE INVENTION

In order to solve the problems, it is an object of the present invention to provide a cell array structure capable of effectively constructing an ECC circuit.

It is another object of the present invention to provide a hierarchy bit line where bit line signals in two columns or four columns are shared in one global bit line signal.

In order to accomplish the objects, the present invention is characterized in that in a FeRAM with folded bit lines, it has a hierarchy bit line where bit line signals in two or more columns commonly share one global bit line signal.

Further, the present invention is characterized in that in a FeRAM with opened bit lines, it has a hierarchy bit line where bit line signals in two or more columns commonly share one global bit line signal.

More specifically, a semiconductor device with the hierarchy bit line according to the present invention is characterized in that cell array blocks with the folded bit lines transferred with cell data of FeRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

And, a semiconductor device with the hierarchy bit line according to the present invention is characterized in that cell array blocks with the opened bit lines transferred with cell data of FeRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

Herein, the sense amps can be applied with different column select signals.

And, a pair of the sense amps each arranged in the two columns can share the pair of global bit lines.

And, four columns are formed between the pair of global bit lines, and the sense amps can share the pair of global bit lines while being alternatively arranged in the neighboring columns.

And, the four sense amps each arranged in the four columns can share the pair of global bit lines.

BEST MODE FOR CARRYING OUT THE INVENTION

Hereinafter, the embodiments of the present invention will be described in more detail with reference to the attached drawings.

Figure 1:
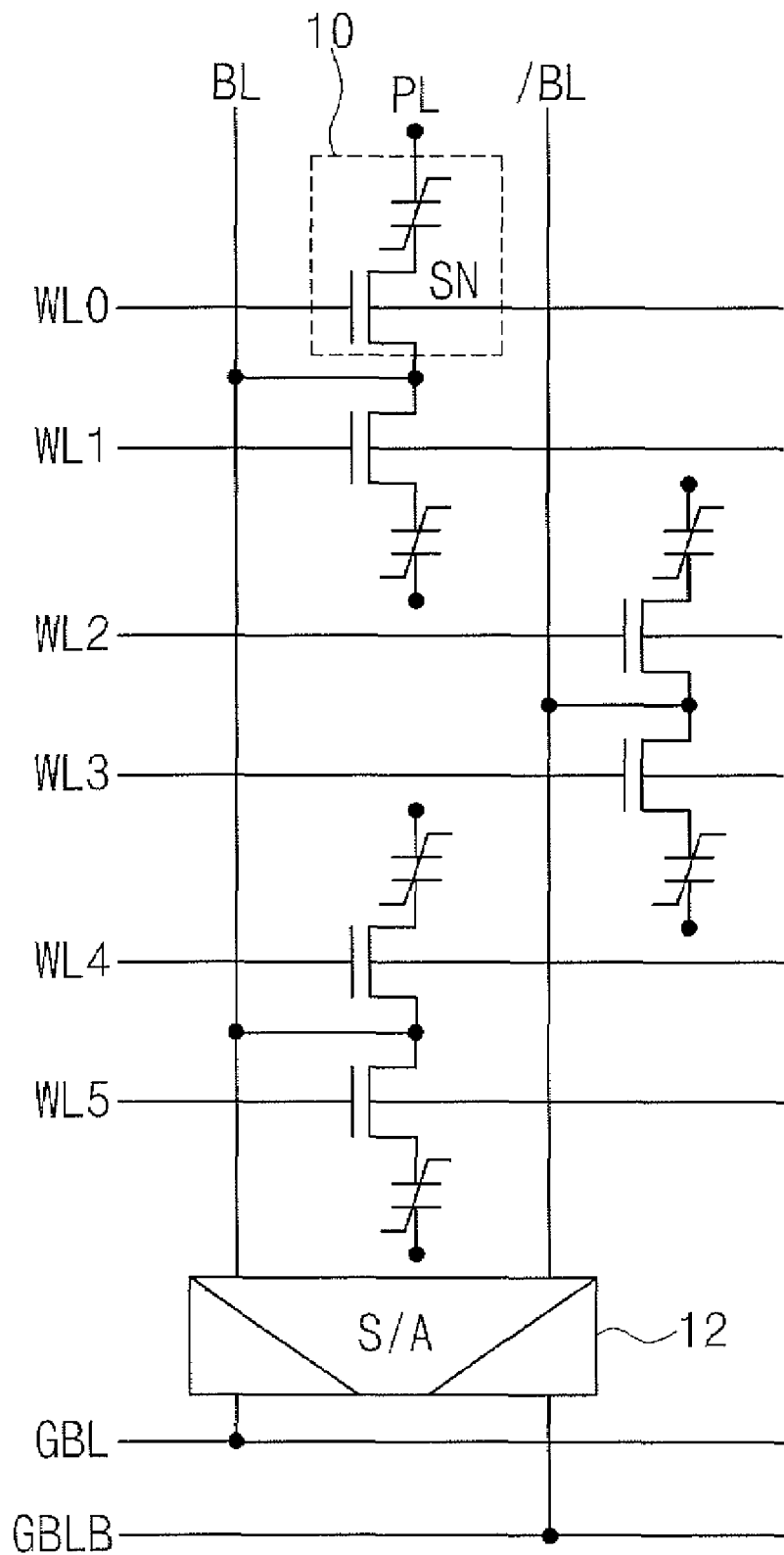
FIG. 1 is a circuit diagram with respect to a cell array and a sense amp with folded bit lines according to the present invention.

Referring to FIG. 1, a cell array constructed in folded bit lines is shown. A FeRAM cell 10 is constructed of one ferroelectric capacitor and one NMOS transistor adjusted by a word line WL.

In the FeRAM cell 10, a drain terminal of the NMOS transistor is connected to a bit line BL and a source terminal thereof is connected to one electrode of the ferroelectric capacitor. The source terminal of the NMOS transistor connected to the ferroelectric capacitor is defined as a storage node stored with written charge.

The other electrode PL of the ferroelectric capacitor is connected to a cell plate and is applied with cell plate voltage PL. A VDD is defined as a high operation voltage of cell.

Both output terminals of a latch type sense amp 12 (S/A) are connected to the folded bit lines, that is, bit lines BL and /BL. If a word line WL0 is activated to transfer the cell data to the bit line BL, the bit line /BL is supplied with reference voltage. The data input and output of the sense amp 12 are made by global lines GBL and GBLB.

Figure 2:
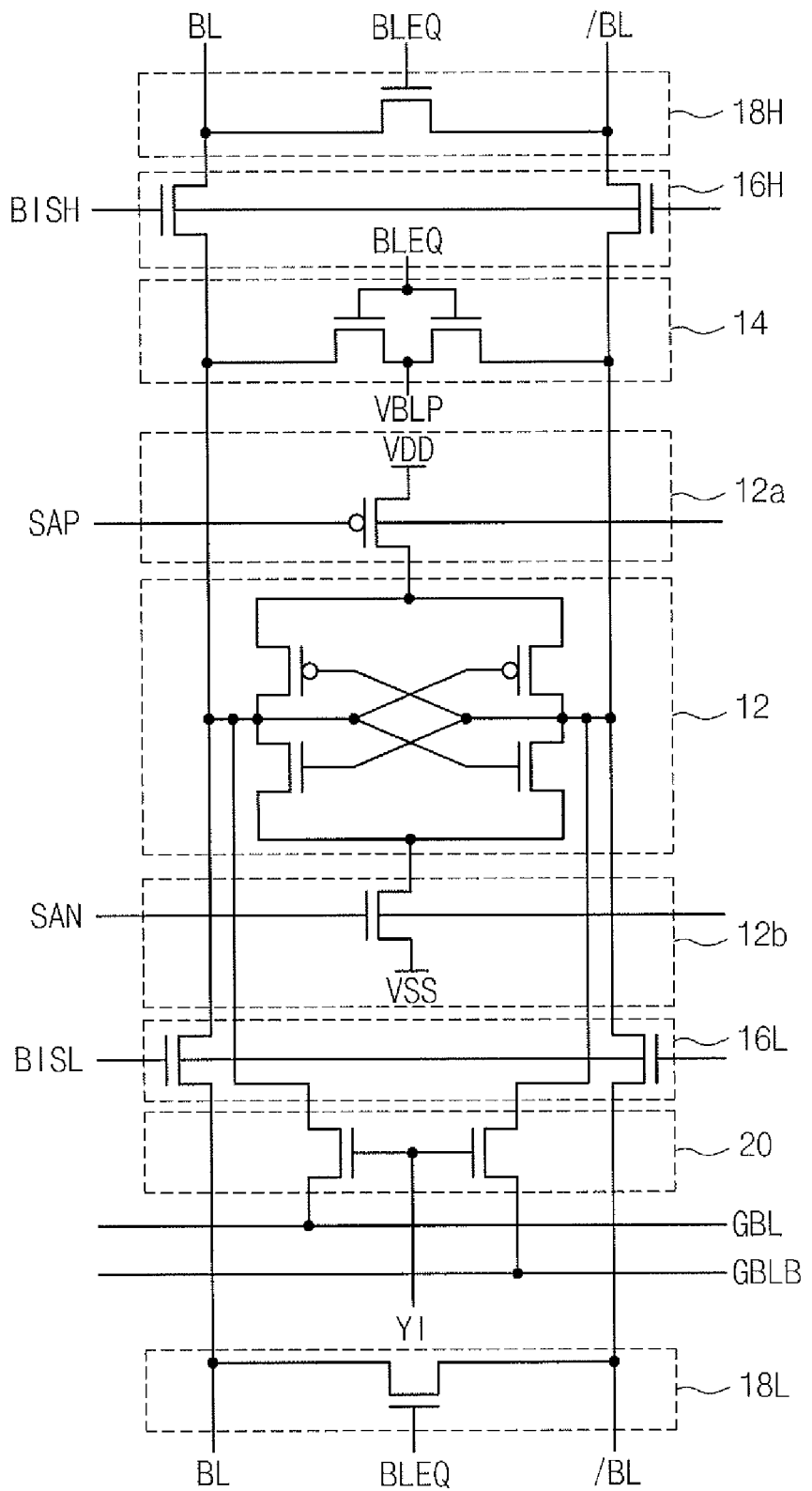
FIG. 2 is a block circuit diagram with respect to the sense amp with the folded bit lines according to the present invention.

FIG. 2 is a block circuit diagram with respect to the sense amp with the folded bit lines. FIG. 2 is constructed of the latch type sense amp 12, sense amp drivers 12a and 12b, a precharger 14, bit line selectors 16H and 16L, and equalizers 18H and 18L, and a column selector 20.

The sense amp 12 is a latch type. A pull up activation stage connected to the sense amp driver 12a is adjusted by a SAP and a pull down activation stage connected to the sense amp driver 12b is adjusted by a SAN.

The bit lines BL and /BL are precharged by using the precharger 14 and are supplied with bit line precharge voltage VSS by using an equalizing signal BLEQ for precharging. Herein, the bit line precharge voltage VSS is ground voltage.

The sense amp 12 and the data inputs and outputs of the global lines GBL and GBLB are performed by a column select signal Y1 applied to the column selector 20. The data exchange between the sense amp 12 and the bit lines BL and /BL of the cell array is performed by the operation of the bit line selector 16H and 16L, and the bit line selector 16H and 16L are operated by the bit line select signals BISH and BISL. Also, the equalizers 18H and 18L allows the voltage between the bit lines BL and /BL to be identical by using the bit line equalizing signal BLEQ.

Figure 3:
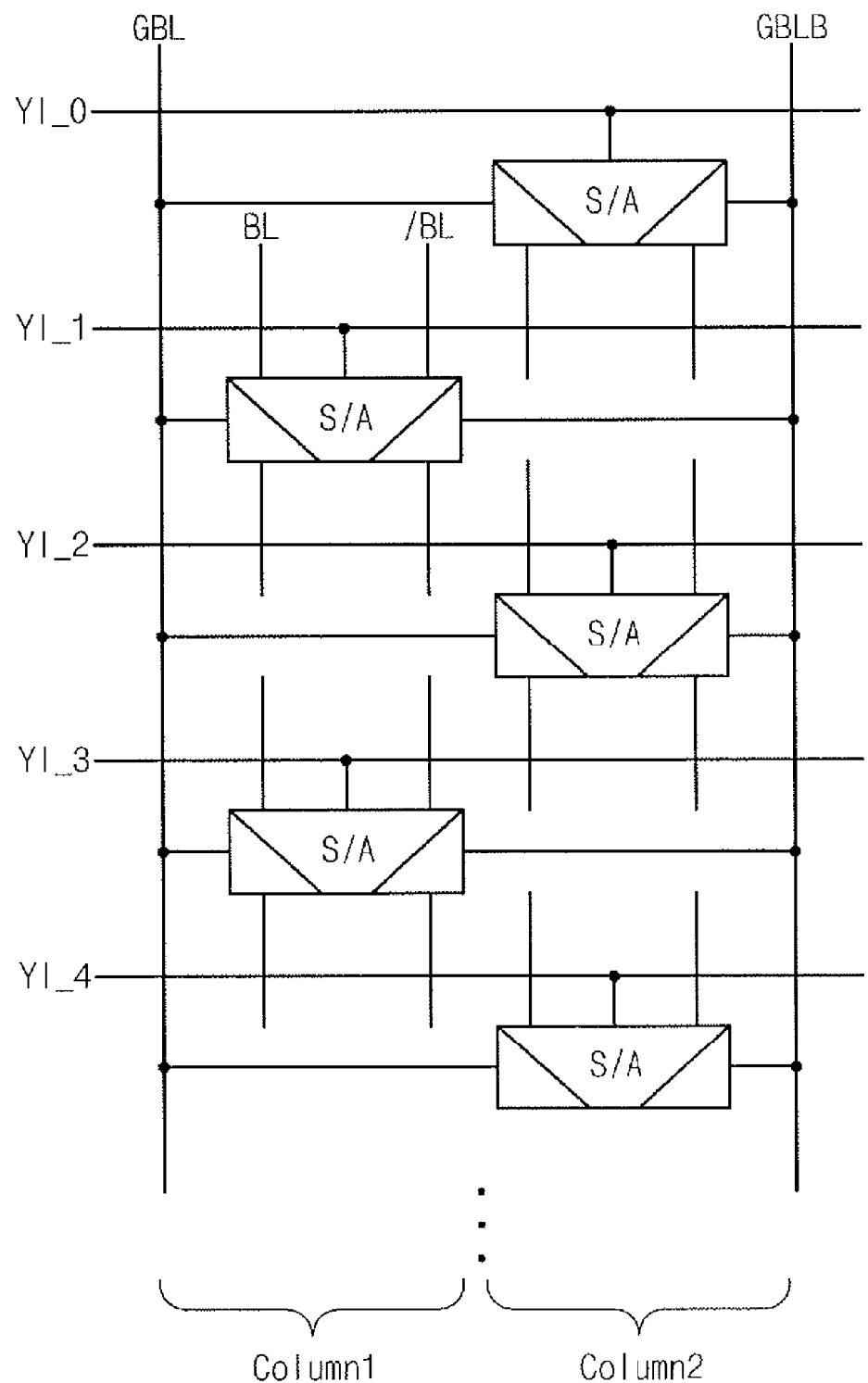
FIG. 3 is a circuit diagram of a memory device with a hierarchy bit line sharing two columns with respect to the folded bit lines, according to a first embodiment of the present invention.

FIG. 3 is a circuit diagram of a memory device with a hierarchy bit line sharing two columns with respect to the folded bit lines, according to a first embodiment of the present invention.

Referring to FIG. 3, the bit lines BL and /BL of the top cell array block and the bit lines BL and /BL of the bottom cell array block have a constitution using the common sense amps (S/A).

Each of the sense amps is arranged on the upper and lower edge parts of the cell array block, respectively. The number of the sense amps on the one edge part of the cell array corresponds to a half of the number of the columns constructed of the bit lines BL and /BL.

The inputs and outputs of the two sense amps in the two columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the two columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signals in the two columns become a hierarchy bit line construction commonly sharing the one global bit line signal.

Figure 4:
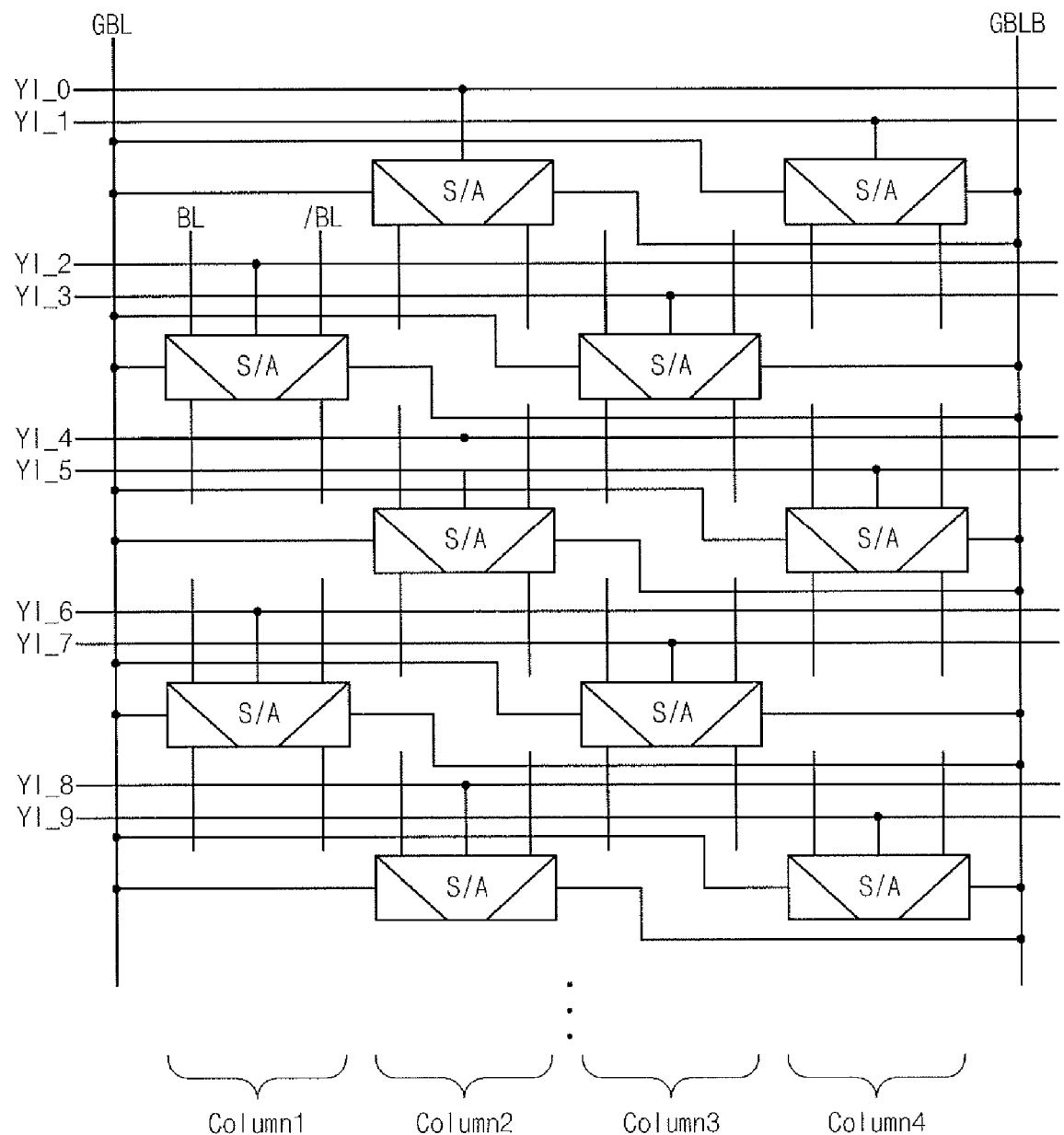
FIG. 4 is a circuit diagram of a memory device with a hierarchy bit line sharing four columns with respect to the folded bit lines, according to a second embodiment of the present invention.

FIG. 4 is a circuit diagram of a memory device with a hierarchy bit line sharing four columns with respect to the folded bit lines, according to a second embodiment of the present invention.

Referring to FIG. 4, the bit lines BL and /BL of the top cell array block and the bit lines BL and /BL of the bottom cell array block have a constitution using the common sense amps (S/A).

Each of the sense amps is arranged on the upper and lower edge parts of the cell array block, respectively. The number of the sense amps on the one edge part of the cell array corresponds to a half of the number of the columns constructed of the bit lines BL and /BL.

The inputs and outputs of the four sense amps in the four columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the four columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signals in the four columns becomes a hierarchy bit line construction commonly sharing the one global bit line signal.

Figure 5:
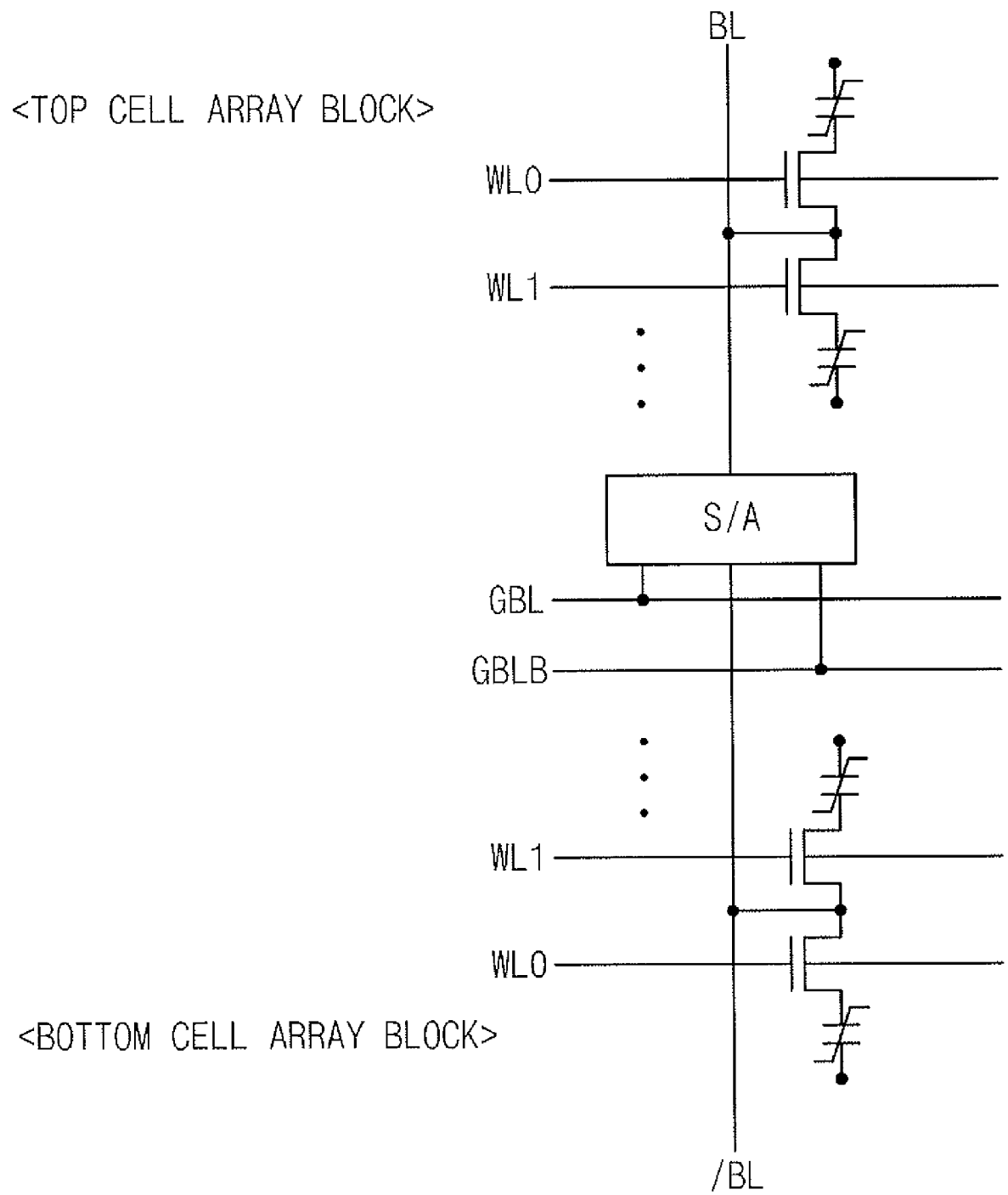
FIG. 5 is a circuit diagram with respect to a cell array and a sense amp with opened bit lines according to the present invention.
Figure 6:
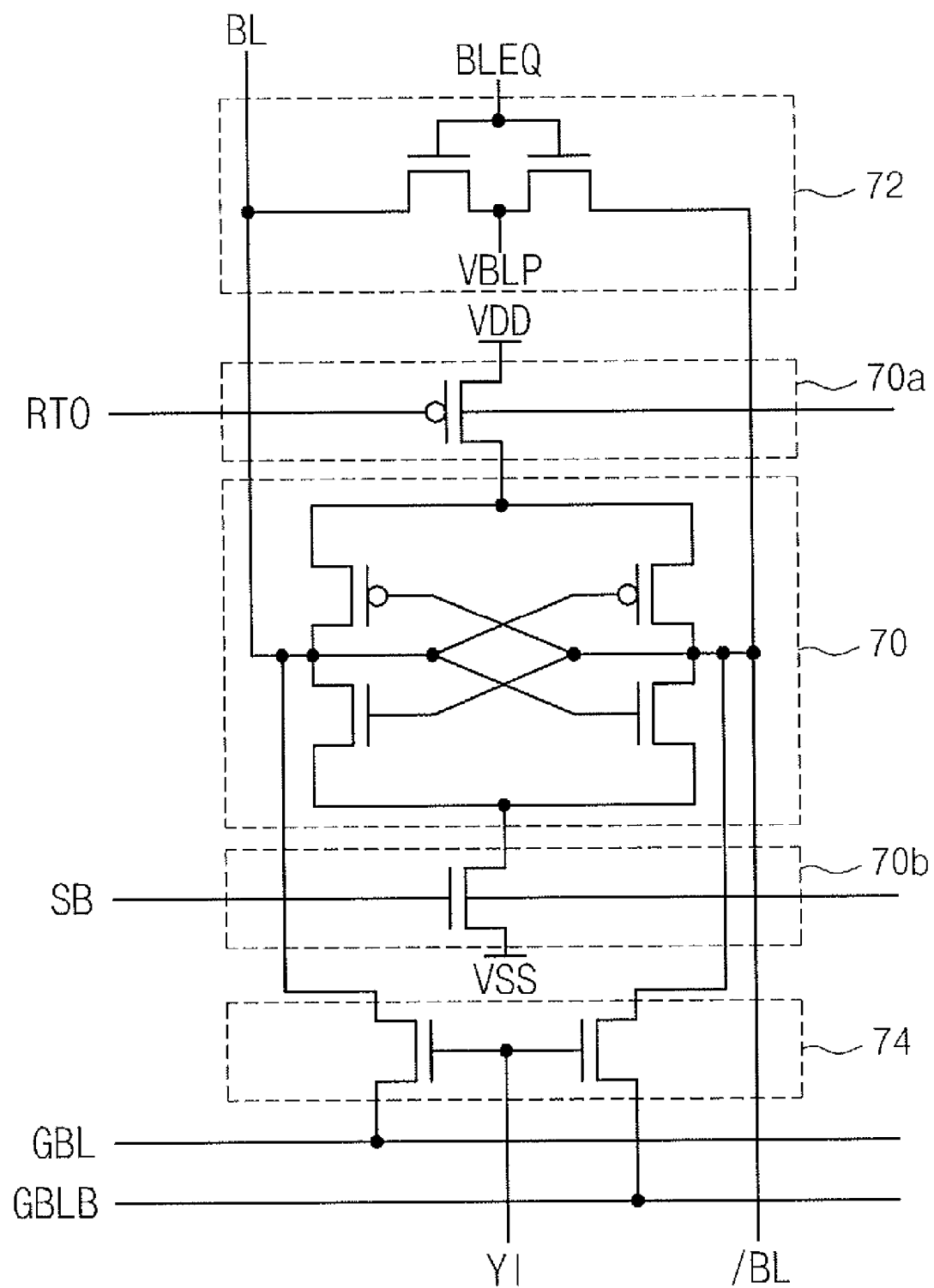
FIG. 6 is a circuit diagram of a sense amp with the opened bit lines according to the present invention.

FIG. 5 is a circuit diagram with respect to an opened bit line cell array and a sense amp according to the present invention. FIG. 6 is a circuit diagram of an opened bit line sense amp to which the present invention is applied. The structure diagram of the opened bit lines of FIGS. 5 and 6 are can be applied to the present invention as in FIG. 7.

Figure 7:
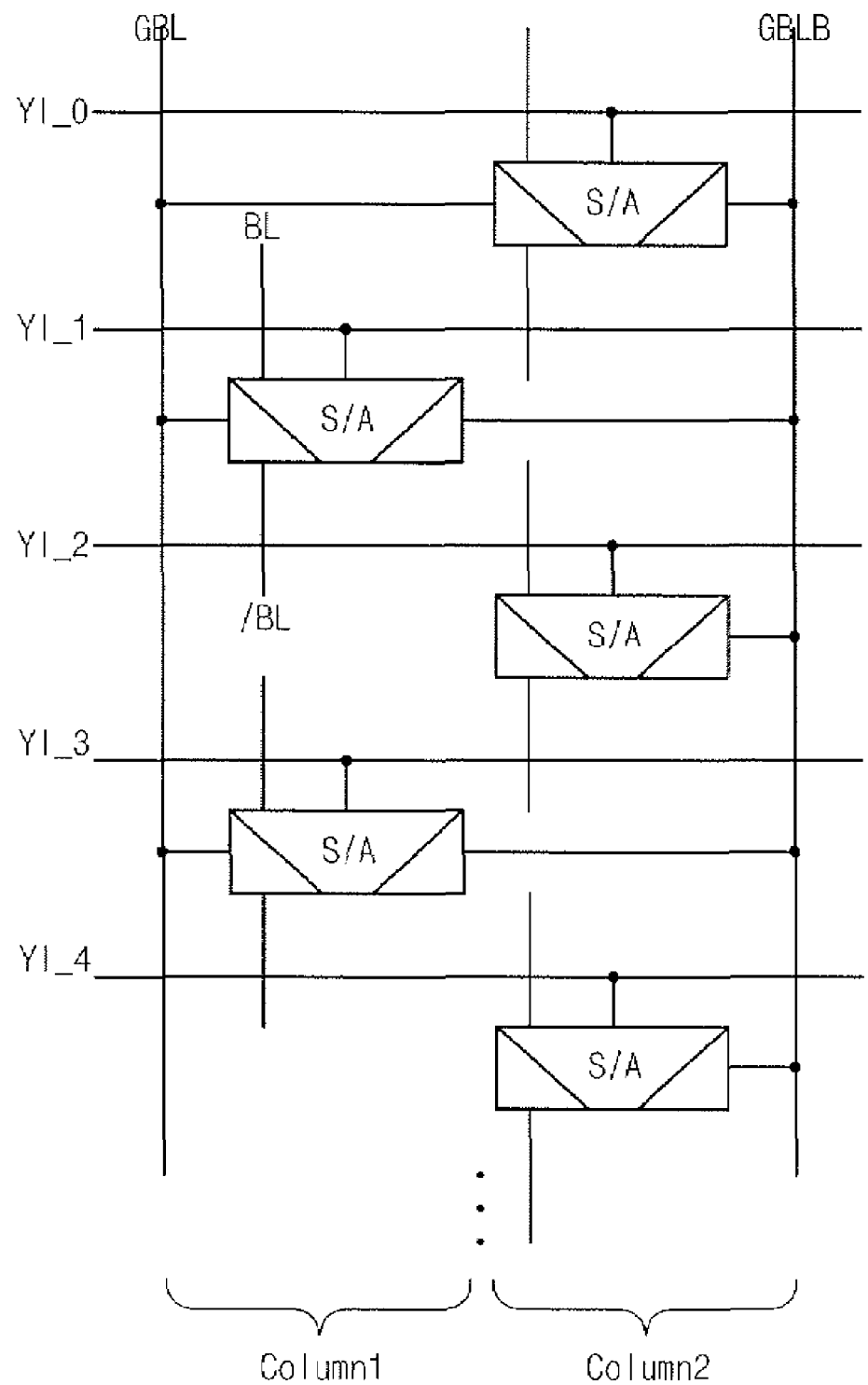
FIG. 7 is a circuit diagram of a memory device with a hierarchy bit line sharing two columns with respect to the opened bit lines, according to a third embodiment of the present invention.

In FIG. 7, a pair of opened bit lines BL and /BL are connected to share a sense amp 70, sense amp drivers 70a and 70b is constructed to drive the sense amp by driving signals RTO and SB, a bit line precharger 72 precharges the bit lines BL and /BL with voltage VSS by the bit line equalizing signal BLEQ, and a column selector 74 is operated by the column select signal.

FIG. 7 is a circuit diagram of a memory device with a hierarchy bit line sharing two columns with respect to the opened bit lines, according to a third embodiment of the present invention.

Referring to FIG. 7, the bit line BL of the top cell array block and the bit line /BL of the bottom cell array block have a constitution using the common sense amps (S/A) Each of the sense amps is arranged on the upper and lower edge parts of the cell array block, respectively. The number of the sense amps on the one edge part of the cell array corresponds to a half of the number of the columns constructed of the bit line BL.

The inputs and outputs of the two sense amps in the two columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the two columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signals in the two columns become a hierarchy bit line construction commonly sharing the one global bit line signal.

Figure 8:
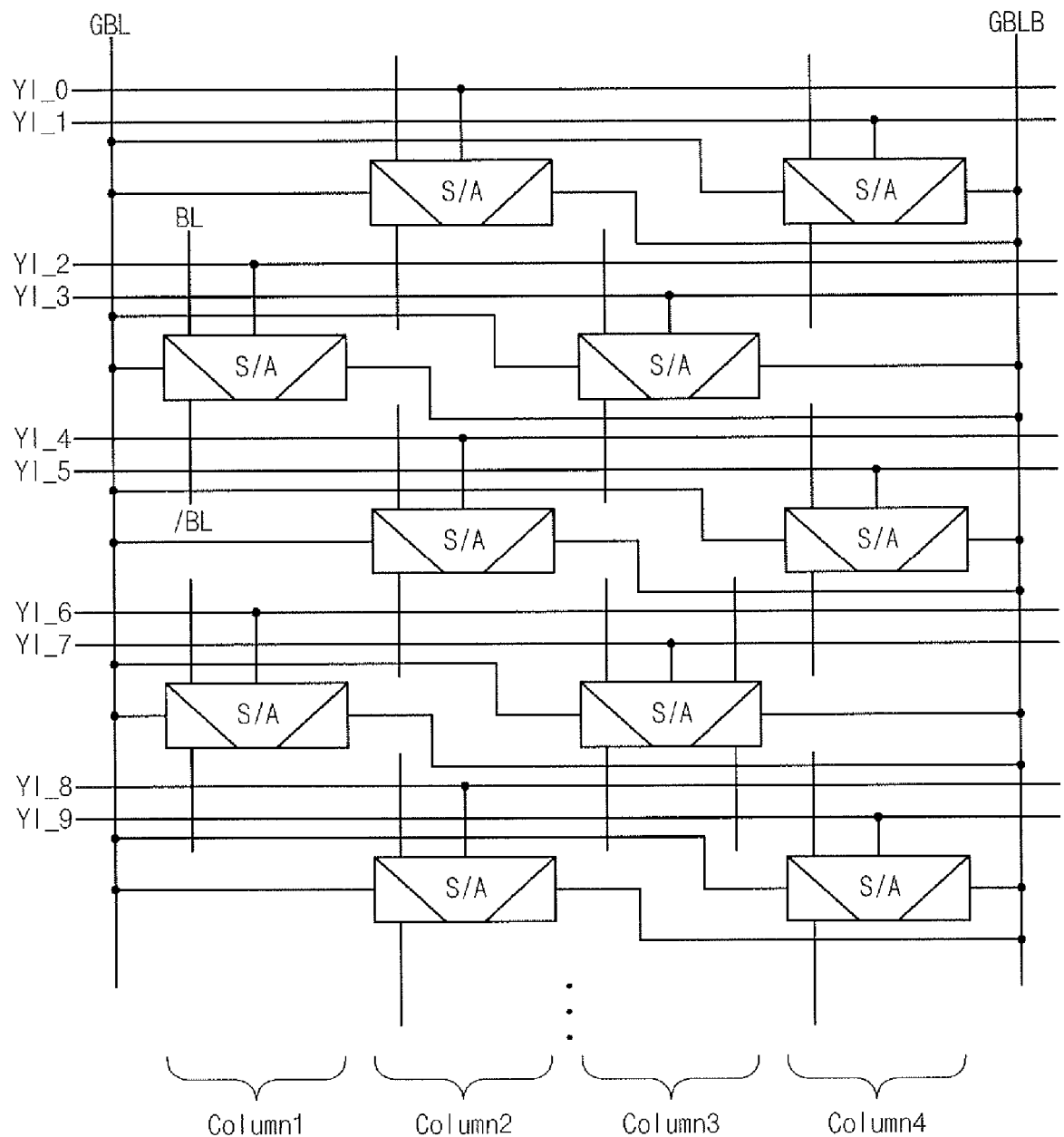
FIG. 8 is a circuit diagram of a memory device with a hierarchy bit line sharing four columns with respect to the opened bit lines, according to a fourth embodiment of the present invention.

FIG. 8 is a circuit diagram of a memory device with a hierarchy bit line sharing four columns with respect to the opened bit lines, according to a fourth embodiment of the present invention.

Referring to FIG. 8, the bit line BL of the top cell array block and the bit line /BL of the bottom cell array block have a constitution using the common sense amps (S/A).

Each of the sense amps is arranged on the upper and lower edge parts of the cell array block, respectively. The number of the sense amps on the one edge part of the cell array corresponds to a half of the number of the columns constructed of the bit line BL.

The inputs and outputs of the four sense amps in the four columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the four columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signals in the four columns become a hierarchy bit line construction commonly sharing the one global bit line signal.

INDUSTRIAL APPLICABILITY

As described above, the present invention has an effect of providing a cell array structure effectively adapted to construct an ECC circuit because it has a hierarchy construction where bit line signals in two columns or four columns commonly share one global bit line signals.

Also, the preferred embodiments of the present invention are disclosed only by way of example. It will be appreciated that those skilled in the art, on consideration of this disclosure, may make modifications and improvements within the spirit and scope of the present invention.

The invention claimed is:

1. A semiconductor device with the hierarchy bit line is characterized in that:
cell array blocks with the folded bit lines transferred with cell data of FeRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

2. The semiconductor device with the hierarchy bit line as set forth in claim 1, wherein the sense amps can be applied with different column select signals.

3. The semiconductor device with the hierarchy bit line as set forth in claim 1, wherein a pair of the sense amps each arranged in the two columns can share the pair of global bit lines.

4. The semiconductor device with the hierarchy bit line as set forth in claim 1, wherein four columns are formed between the pair of global bit lines, and the sense amps can share the pair of global bit lines while being alternatively arranged in the neighboring columns.

5. The semiconductor device with the hierarchy bit line as set forth in claim 1, wherein the four sense amps each arranged in the four columns can share the pair of global bit lines.

6. A semiconductor device with the hierarchy bit line, is characterized in that:
cell array blocks with the opened bit lines transferred with cell data of FeRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

7. The semiconductor device with the hierarchy bit line as set forth in claim 6, wherein the sense amps can be applied with different column select signals.

8. The semiconductor device with the hierarchy bit line as set forth in claim 6, wherein a pair of the sense amps each arranged in the two columns can share the pair of global bit lines.

9. The semiconductor device with the hierarchy bit line as set forth in claim 6, wherein four columns are formed between the pair of global bit lines, and the sense amps can share the pair of global bit lines while being alternatively arranged in the neighboring columns.

10. The semiconductor device with the hierarchy bit line as set forth in claim 6, wherein the four sense amps each arranged in the four columns can share the pair of global bit lines.

* * * * *